United States Patent
Bhatia et al.

(10) Patent No.: US 11,977,407 B2
(45) Date of Patent: May 7, 2024

(54) GLITCH-FREE SYNCHRONIZATION AND SYSREF WINDOWING AND GENERATION SCHEME

(71) Applicant: TEXAS INSTRUMENTS INCORPORATED, Dallas, TX (US)

(72) Inventors: Apoorva Bhatia, Lucknow (IN); Pranav Kumar, Ranchi (IN); Abhrarup Barman Roy, Bangalore (IN); Peeyoosh Mirajkar, Bangalore (IN); Raghavendra Reddy, Prakasam (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/683,185

(22) Filed: Feb. 28, 2022

(65) Prior Publication Data
US 2022/0382320 A1 Dec. 1, 2022

(30) Foreign Application Priority Data
May 31, 2021 (IN) .............................. 202141024279

(51) Int. Cl.
  G06F 1/12 (2006.01)
  G06F 1/08 (2006.01)
  H03K 3/037 (2006.01)
  H03K 19/20 (2006.01)

(52) U.S. Cl.
  CPC ............... *G06F 1/12* (2013.01); *G06F 1/08* (2013.01); *H03K 3/037* (2013.01); *H03K 19/20* (2013.01)

(58) Field of Classification Search
  CPC .. G06F 1/12; G06F 1/08; H03K 3/037; H03K 19/20; H03K 3/356
  USPC .......................................................... 327/155
  See application file for complete search history.

(56) References Cited

U.S. PATENT DOCUMENTS

| | | | |
|---|---|---|---|
| 11,483,005 B1 * | 10/2022 | Uvieghara | H03L 7/083 |
| 2016/0041579 A1 * | 2/2016 | Ali | H04B 15/00 713/400 |
| 2018/0323790 A1 * | 11/2018 | Dusad | G06F 1/10 |
| 2019/0313938 A1 * | 10/2019 | Taft | H03K 3/0375 |
| 2020/0097038 A1 * | 3/2020 | Kinnerk | G06F 1/14 |
| 2022/0382320 A1 * | 12/2022 | Bhatia | G06F 1/12 |

OTHER PUBLICATIONS

JESD204B Clock Generator with 14 LVDS/HSTL Outputs Data Sheet AD9528, Feb. 29, 2020, pp. 1-67, XP055958625.
International Search Report in corresponding PCT Application No. PCT/US2022/031523, dated Sep. 15, 2022 (5 pages).

* cited by examiner

*Primary Examiner* — Ryan Jager
(74) *Attorney, Agent, or Firm* — Valerie M. Davis; Frank D. Cimino

(57) ABSTRACT

In an example, a system is adapted to be coupled to a load device having a load clock. The system includes a clock generation device with a pin. The system also includes a capture circuit coupled to the pin and operable to sample a value at the pin. The system includes a D flip-flop having a data input coupled to the capture circuit, a clock input coupled to a clock, and having an output, where the D flip-flop is operable to provide, at the output, a system reference event (SYSREF) signal to align the load clock to the clock, based at least in part on the value at the pin.

20 Claims, 6 Drawing Sheets

GLITCH-FREE SYNCHRONIZATION AND SYSREF WINDOWING AND GENERATION SCHEME

CROSS-REFERENCE TO RELATED APPLICATIONS

The present application claims priority to India Provisional Patent Application No. 202141024279, which was filed May 31, 2021, is titled "Glitch-Free Synchronization And SYSREF Windowing And Generation Scheme," and is hereby incorporated herein by reference in its entirety.

BACKGROUND

Clock generation/distribution devices are useful for generating/distributing signals with a wide range of frequencies for various applications. As one example, clock generation/distribution devices can provide clock reference signals to multiple load devices. A system reference event (SYSREF) signal may be useful for aligning load clocks in load devices. For example, a SYSREF signal may be a periodic signal that is sampled by a device (such as an analog-to-digital converter, ADC) and is used to align the boundary of a local multi-frame clock used by the device.

For high frequency synchronization, windowing may be useful to determine the position of a SYSREF signal with respect to a clock edge and create a delayed SYSREF replica within a proper timing window. Also, a load device may request a SYSREF signal from the clock generation/distribution device.

SUMMARY

In accordance with at least one example of the description, a system is adapted to be coupled to a load device having a load clock. The system includes a clock generation device with a pin. The system also includes a capture circuit coupled to the pin and operable to sample a value at the pin. The system includes a D flip-flop having a data input coupled to the capture circuit, a clock input coupled to a clock, and having an output, where the D flip-flop is operable to provide, at the output, a system reference event (SYSREF) signal to align the load clock to the clock, based at least in part on the value at the pin.

In accordance with at least one example of the description, a method includes performing a sampling of a value at a user interface of a clock generation device. The method includes, responsive to the value being a first value, entering a windowing mode. The method also includes determining a position of a synchronization (SYNC) signal or a SYSREF signal request with respect to a clock. The method includes programming a register to delay the SYNC signal or the SYSREF request.

In accordance with at least one example of the description, a method includes performing a first sampling of a value at a user interface of a clock generation device. The method also includes, responsive to the value being a first value, entering a capture mode. The method includes performing a second sampling of a value at the user interface. The method also includes responsive to the value of the second sampling, entering a synchronization mode or a SYSREF signal request mode.

BRIEF DESCRIPTION OF THE DRAWINGS

The same reference numbers or other reference designators are used in the drawings to designate the same or similar (functionally and/or structurally) features.

DETAILED DESCRIPTION

Clock generation/distribution devices can provide clock reference signals to multiple load devices in a variety of applications (e.g., ADCs, radio frequency (RF) receivers, RF transmitters, cellular base station transmitters, wireless backhaul, etc.). Load devices (e.g., electronic components within a chip) can send a request to a source device (e.g., the clock generation/distribution component within the chip) for a SYSREF signal. After receiving the request, the source device sends the SYSREF signal to the load device or devices. The load devices use the SYSREF signals to align the local load clocks in the load devices. Clock generation devices may also need a synchronization (SYNC) operation to maintain a deterministic relation between a clock signal and the SYSREF signal. The internal circuitry of the source devices is synced to a clock edge without any setup or hold violations so SYSREF can be provided deterministically to the load devices. In some clock generation/distribution devices, one device pin is used for SYNC and another pin is used for SYSREF generation control. However, two pins may not be available on a pin-limited device (e.g., a 40-pin RF multiplier/buffer/divider, or a 40-pin or 48-pin frequency synthesizer chip).

In examples herein, a one-pin interface provides both SYNC and SYSREF generation control. The pin functionality may be programmed with any device communication interface (e.g., a Serial Peripheral Interface). Also, a windowing scheme is described herein that provides for SYNC and SYSREF generation at high frequencies for multi-device synchronization. Windowing determines a position of the SYSREF signal with respect to a clock edge of an internal clock and provides a delayed replica of the SYSREF signal within a reliable window, to avoid setup and hold violations. Windowing may be performed simultaneously with SYSREF generation without a glitch at the output. Simultaneous windowing and SYSREF generation provides flexibility to evaluate the position of a synchronization signal with respect to the clock without disturbing the SYSREF output. Also, the output may be muted during synchronization to allow SYSREF to be provided glitch-free to load devices.

Figure 1:
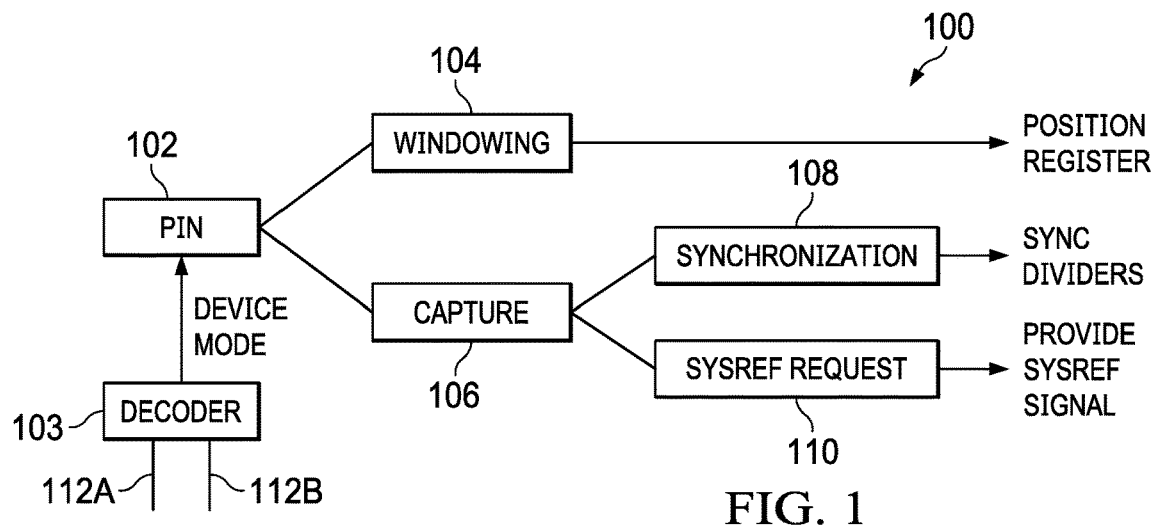
FIG. 1 is a block diagram of a one-pin synchronization and SYSREF windowing and generation system in accordance with various examples.

FIG. 1 is a block diagram 100 of a one-pin synchronization and SYSREF windowing and generation system in accordance with various examples herein. The system includes a single pin 102 interface, which may be programmed by a decoder 103 to provide SYSREF for either windowing 104 or capture 106. Capture means sampling a signal on a pin at a specified time, such as on a rising edge without any setup-hold violation. In a capture mode, either synchronization 108 or SYSREF request 110 may be performed. Decoder 103 may be any suitable hardware and/or software that provides a device mode for a clock generation/distribution device. In one example, decoder 103 includes a two-bit interface, represented by bits 112A and 112B. In this example, bit 112A is a most significant bit (MSB) and bit 112B is a least significant bit (LSB). A user may use bits 112A and 112B to put the clock generation/distribution device in a specific mode.

As described above, two bits may be written to select the device mode. For example, an MSB (e.g., bit 112A) set at 1 may select windowing 104. Windowing is performed with a position register as described below. The MSB set at 0 may select capture 106. Then, the second bit (e.g., 112B) may select between synchronization 108 and SYSREF request 110, after entering capture mode. The synchronization process is described below. The SYSREF request provides a SYSREF signal to load devices as described below. In some examples, the term "pin" is generically used to designate a connector to another device (such as a pin used on a pin-grid array, a lead on a lead frame, a ball on a ball grid array or any other connection that can be used to connect one device, such as an integrated circuit, to another device).

Figure 2:
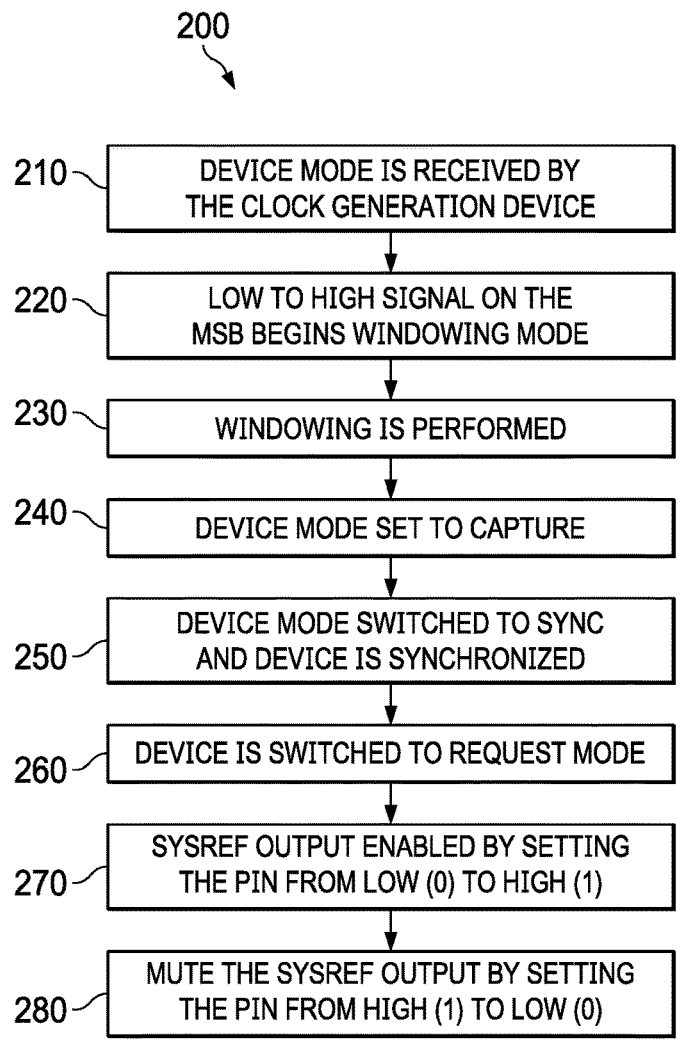
FIG. 2 is a flow diagram of a method for one-pin synchronization and SYSREF windowing and generation in accordance with various examples.

FIG. 2 is a flow diagram of a method 200 for one-pin synchronization and SYSREF windowing and generation in accordance with various examples herein. Method 200 is one example of the processes described herein. The steps of method 200 may be performed in any suitable order.

Method 200 begins at 210, where the device mode is received by the clock generation/distribution device. The device mode may be communicated from a user via two bits, such as bits 112A and 112B. For example, the MSB may select between windowing 104 or capture 106 based on the value of the MSB.

Method 200 continues at 220, where a low (0) to high (1) on the MSB 112A may indicate windowing 104. Method 200 then continues at 230, where windowing is performed. The position register may be updated and a select register programmed, as described below. This process determines the position of the SYSREF signal with respect to an input clock edge and provides a delayed replica of the SYSREF signal. The select register may be programmed according to the position of the SYSREF signal to delay the SYSREF signal such that setup and hold timing is met. An example windowing scheme is described below.

Method 200 continues at step 240, where a user can deprogram the pin of the clock generation/distribution device (e.g., pin 102) and set the mode to capture via the MSB (e.g., bit 112A) going from high to low. Then, the device mode is switched to synchronization (SYNC) mode with (0) on the LSB (e.g., 112B). Method 200 continues at 250, where the device is synchronized without setup or hold issues.

Method 200 continues at 260, where the device is switched to request mode. The device may be switched by deprogramming the two-bit interface (e.g., 112A and 112B), setting the mode to capture via the MSB 112A, and then switching to request mode with a low (0) to high (1) on the LSB. After entering request mode, the method may enable SYSREF output by setting the pin 102 from low (0) to high (1) at 270. At 280, the method may mute the SYSREF output by setting the pin 102 from high (1) to low (0). In examples herein, the output is not disturbed by switching between the modes using, for example, decoder 103. Also, the user can return to windowing mode after request mode using a user interface such as decoder 103 without disturbing the output.

Frequent windowing operations are useful for high frequency synchronization where the SYNC and SYSREF request (SYSREFREQ) pulse (referred to as the SYNC/SYSREFREQ pulse) and the relative position of the clock changes, for example with respect to temperature. In examples herein, windowing may be performed simultaneously with SYSREF generation without a glitch at the output. Also, the output is muted during synchronization to allow SYSREF to be provided glitch-free to load devices.

Figure 3A:
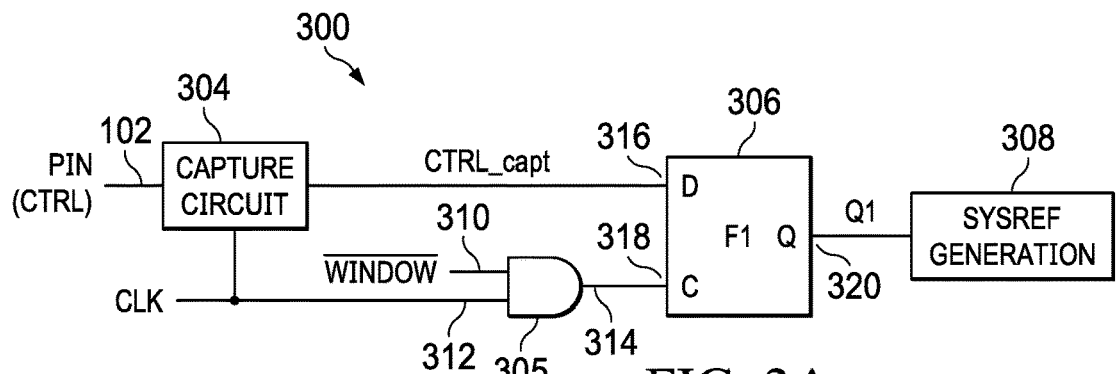
FIG. 3A is a schematic diagram of a system for providing simultaneous windowing and SYSREF generation in accordance with various examples.

FIG. 3A is a schematic diagram of a system 300 for providing simultaneous windowing and SYSREF generation in accordance with various examples herein. System 300 includes a pin 102, capture circuit 304, AND gate 305, flip-flop 306, and SYSREF generation block 308 (e.g., a SYSREF generator). AND gate 305 includes first input 310, second input 312, and output 314. Flip-flop 306 includes a D input 316, clock input 318, and output 320 (also referred to herein as Q1).

In an example, the clock generation/distribution device is in the request mode (such as SYSREF request 110), which is a non-windowing mode as described above. In operation, a signal on pin 102 (e.g., CTRL) is captured by capture circuit 304, which provides a signal CTRL_capt to flip-flop 306. Capture circuit 304 helps in deterministically sampling the CTRL signal given by the user on the rising edge of the CLK. The CTRL signal is not shown in FIG. 3B, but CTRl_capt may look like a slightly delayed CTRL signal, depending on when the rising edge of the CLK occurs for the sample. In non-windowing mode, the CTRL_capt signal is sampled on a clock edge by flip-flop 306 and provided to SYSREF generation block 308. SYSREF generation block 308 provides the SYSREF output to load devices. Therefore, if a high (1) signal is provided to pin 102, the SYSREF output is provided by SYSREF generation block 308. If a low (0) signal is provided to pin 102 while in the request mode, the SYSREF output is muted.

In the non-windowing mode as described above, a WINDOW signal is low (0) to represent the non-windowing mode. Therefore, $\overline{\text{WINDOW}}$ applied to first input 310 of AND gate 305 is high (1). If $\overline{\text{WINDOW}}$ is high (1), the clock signal CLK at second input 312 is provided to clock input 318 of flip-flop 306, and the signal at the pin 102 is provided to output 320 of flip-flop 306. If the system is switched to windowing mode (for example, by a user command), the WINDOW signal goes high (1) and $\overline{\text{WINDOW}}$ goes low (0). Clock input 318 of flip-flop 306 therefore stops receiving the CLK signal. Without a CLK signal, a change on pin 102 is not captured by flip-flop 306, because the flop will not sample the input. Output 320 holds its previous value and will not update until the device is again programmed to request mode, and flip-flop 306 starts receiving the CLK input again. Therefore, if WINDOW is high (1), windowing may be performed without any glitch at the output. In some examples, to avoid a transition glitch, the state of pin 102 is made the same responsive to returning to request mode as it was initially when the mode was switched from request to windowing.

Figure 3B:
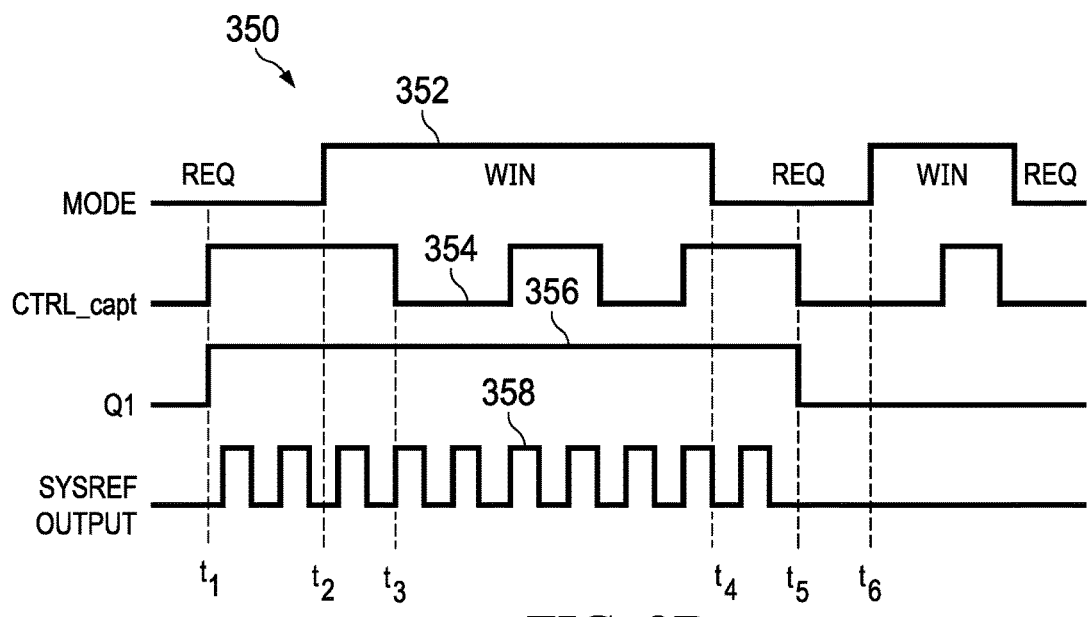
FIG. 3B is a timing diagram of waveforms for providing simultaneous windowing and SYSREF generation in accordance with various examples.

FIG. 3B is a timing diagram of waveforms 350 for providing simultaneous windowing and SYSREF generation in accordance with various examples herein. The waveforms 350 describe the operation of system 300 described above with respect to FIG. 3A. Waveforms 350 include mode 352, CTRL_capt 354, Q1 356, and SYSREF output 358. Mode 352 indicates the mode in which the clock generation/distribution device is operating, which may be set via the MSB 112A in one example. CTRL_capt 354 is the CTRL signal (at pin 102 in FIG. 3A) captured on the rising edge. Q1 is the output 320 of flip-flop 306 as described above. SYSREF output 358 is the output of SYSREF generation block 308, which may be provided at a SYSREF output pin on a chip in some examples.

Mode 352 shows the mode, either request (REQ) or windowing (WIN) mode, which is set by a user as described above. At time $t_1$, in the request mode, CTRL_capt 354 goes high (1) and therefore Q1 356 goes high (1). Responsive to Q1 356 going high, SYSREF output 358 is provided after time $t_1$ by SYSREF generation block 308. At time $t_2$, the mode 352 is changed from REQ to WIN. After time $t_2$, the SYSREF output 358 continues. Therefore, windowing mode may be entered without a glitch of SYSREF output 358. CTRL_capt 354 goes high (1) to low (0) at time $t_3$, but again SYSREF output 358 is not affected. Therefore, as shown in FIG. 3B, in windowing mode the SYSREF output 358 is unaffected, even if CTRL_capt 354 changes state from high (1) to low (0) or from low (0) to high (1).

At time $t_4$, the mode 352 is changed to request mode. Therefore, a change in CTRL_capt 354 while in request mode is propagated to Q1 356 and affects the SYSREF output 358. At time $t_5$, the mode 352 is in request mode and CTRL_capt 354 goes from high (1) to low (0). Therefore, Q1 356 also goes from high (1) to low (0). After Q1 356 goes low (0), SYSREF output 358 is muted and goes to zero. At time $t_6$, a second windowing mode is entered as shown in mode 352. During the second windowing mode, SYSREF output 358 is again unaffected and remains muted. To turn the SYSREF output 358 back on, CTRL_capt 354 should go from low (0) to high (1) while in a request mode for mode 352.

Figure 4A:
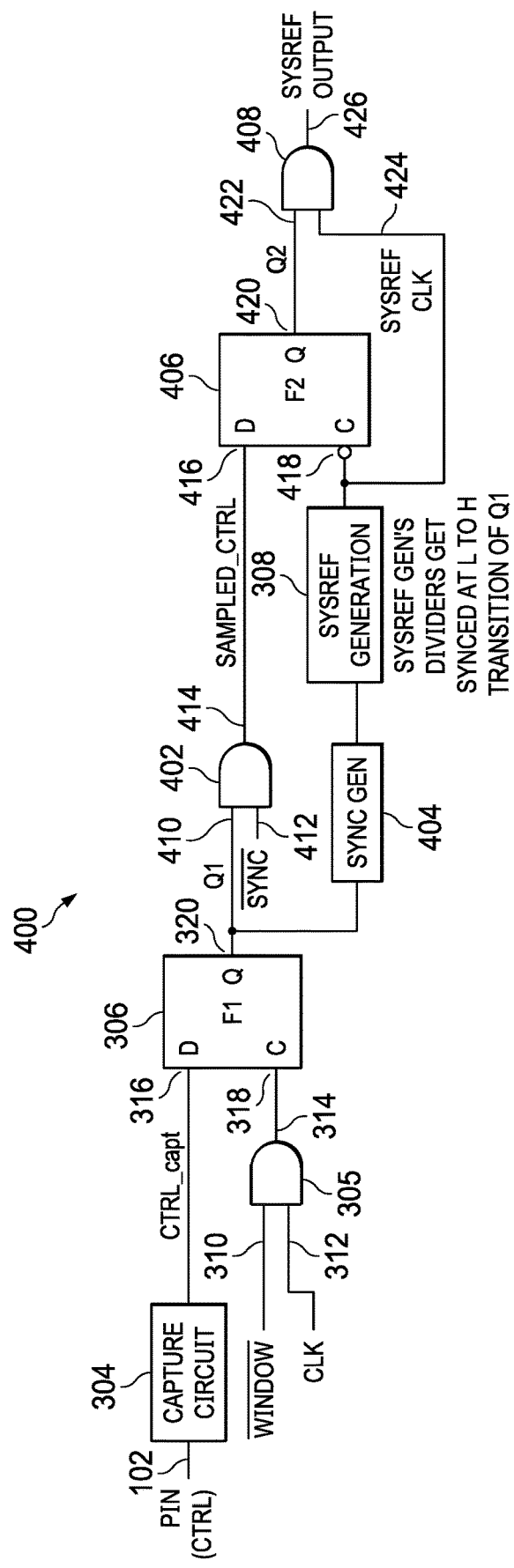
FIG. 4A is a schematic diagram of a system for providing simultaneous windowing, SYSREF generation, and glitch free synchronization in accordance with various examples.

FIG. 4A is a schematic diagram of a system 400 for providing simultaneous windowing and SYSREF generation in accordance with various examples herein. System 400 also includes glitch-free SYSREF output during synchronization due to the SAMPLED_CTRL signal sampled on the negative edge of the SYSREF CLK signal, as described below. In FIG. 4A, the same reference numbers or other reference designators are used as in FIG. 3A to designate the same or similar (functionally and/or structurally) features. FIG. 4A includes the components in FIG. 3A and also includes AND gate 402, SYNC GEN (synchronization generator) 404, flip-flop 406, and gate 408. AND gate 402 includes input 410, input 412, and output 414. Flip-flop 406 includes D input 416, clock input 418, and output 420 (referred to herein as Q2). AND gate 408 includes input 422, input 424, and output 426.

The components from FIG. 3A operate similarly as described above with respect to FIG. 3A. Referring again to FIG. 4A, output 320 (Q1) is provided to input 410 of AND gate 402. Input 412 of AND gate 402 is coupled to a $\overline{\text{SYNC}}$ signal (which indicates whether the device is in SYNC mode). SYNC mode may be set by the two-bit interface, represented by bits 112A and 112B. If the device is in SYNC mode, $\overline{\text{SYNC}}$ is low (0), and the output of AND gate 402 is low (0). Therefore, the SAMPLED_CTRL signal is low (0). If the SAMPLED_CTRL signal is low (0), Q2 is low (0).

The SYSREF output at output 426 is also low (0) in this example, which means that the output stays muted while the device is in SYNC mode. In SYNC mode, the next low (0) to high (1) signal on pin 102 operates to synchronize the SYSREF dividers, as described below with respect to FIG. 4B. That operation synchronizes the SYSREF signal. Also, SYNC GEN 404 is "on" only in SYNC mode. In one example, there should be enough delay between programming the device to SYNC mode and providing a SYNC pulse to allow the device to mute SYSREF.

If the device is in request mode, $\overline{\text{SYNC}}$ is high (1). If $\overline{\text{SYNC}}$ is high, SAMPLED_CTRL is set to the value of Q1 at output 320. $\overline{\text{SYNC}}$ is also high (1) in windowing mode, and SAMPLED_CTRL is set to the value of Q1 under this condition as well. Flip-flop 406 samples on the falling edge (e.g., the transition from high to low) of the signal at clock input 418. SYSREF generation block 308 receives a reset signal from SYNC GEN 404 in sync mode that synchronizes the dividers in SYSREF generation block 308. In request mode, SYSREF generation block 308 provides SYSREF output, and the data in flip-flop 406 is sampled on the negative edge of this signal from SYSREF generation block 308. The SYSREF signal is provided at the output 426 (e.g., SYSREF Output).

Figure 4B:
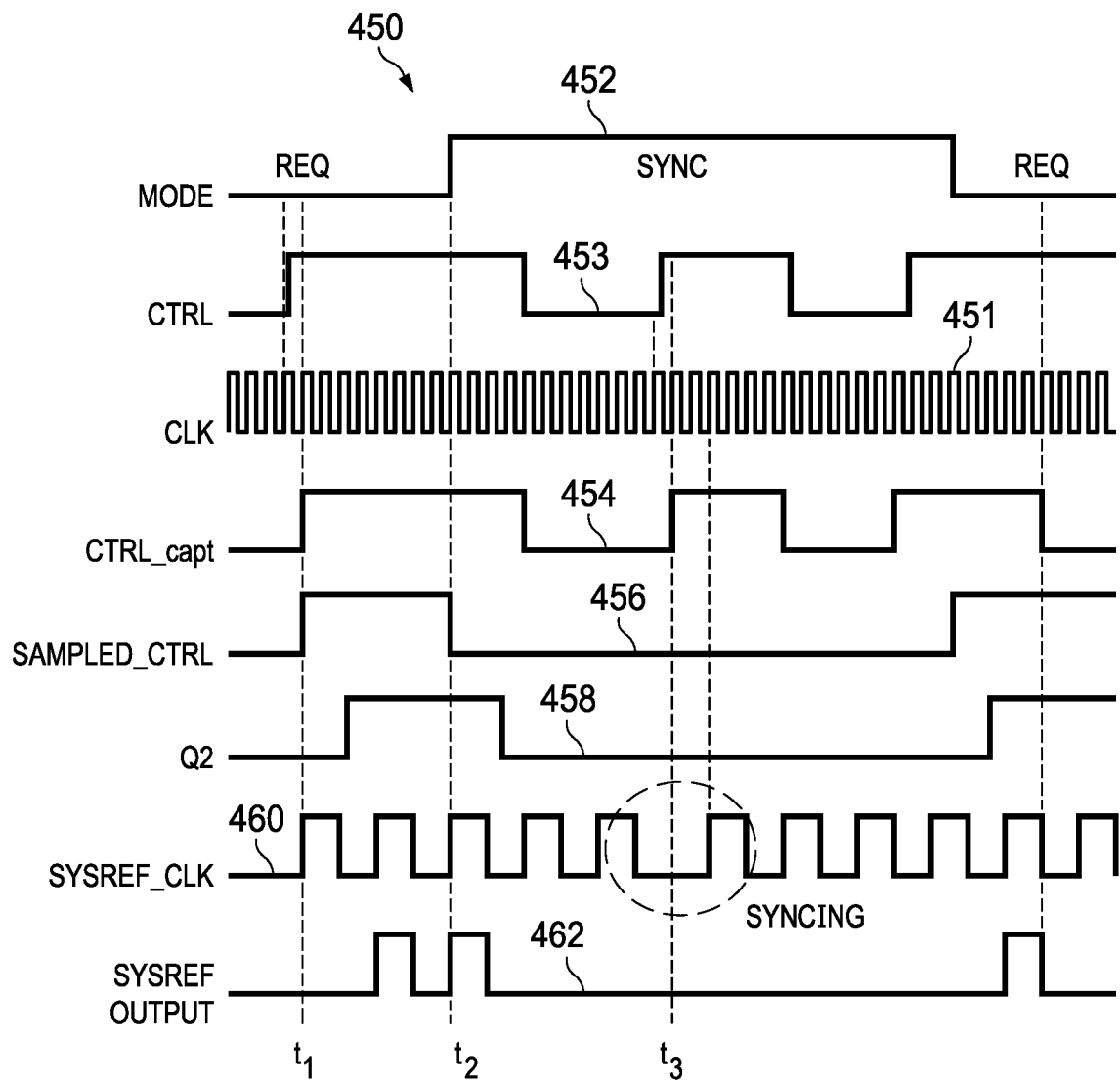
FIG. 4B is a timing diagram of waveforms for providing simultaneous windowing, SYSREF generation, and glitch free synchronization in accordance with various examples.

FIG. 4B is a timing diagram of waveforms 450 for providing simultaneous windowing and SYSREF generation, and glitch-free synchronization in accordance with various examples herein. The waveforms 450 describe the operation of system 400 described above with respect to FIG. 4A. Waveforms 450 include clock (CLK) 451, mode 452, CTRL 453, CTRL_capt 454, SAMPLED_CTRL 456, Q2 458, SYSREF_CLK 460, and SYSREF output 462.

Mode 452 shows whether the device is in request (REQ) mode or synchronization (SYNC) mode. In request mode, a high (1) on pin 102 at time $t_1$ (indicated by CTRL 453) provides: a low (0) to high (1) transition for CTRL_capt signal 454 and SAMPLED_CTRL signal 456; the SYSREF_CLK 460 begins; and SYSREF OUTPUT 462 starts. At time $t_2$, the mode 452 changes from request to SYNC (e.g. low (0) to high (1)), and SAMPLED_CTRL 456 goes low (0). Due to an event at the system level, the SYSREF_CLK (460) may go out of sync (with respect to another device or with respect to its own CLK output clock). Therefore, to re-synchronize, the device is put into SYNC mode (452). In SYNC mode, after SAMPLED_CTRL 456 goes low (0), Q2 458 goes low (0) on negative edge of SYSREF_CLK, and SYSREF OUTPUT 462 is muted without any glitch.

In SYNC mode, CTRL_capt 454 goes high (1) at time $t_3$ due to a user providing a signal at pin 102 (e.g., CTRL 453). This signal (CTRL 453) is a request from the user to perform synchronization. The SYSREF OUTPUT 462 stays muted at time $t_3$. Synchronization is performed by SYNC GEN 404. As shown in FIG. 4B, SYSREF_CLK 460 is synchronized to CLK 451 at time $t_3$.

SYNC GEN 404 provides a synchronization pulse that resets dividers in SYSREF generation block 308. If the device is in request mode, the Q1 signal indicates to the SYSREF generation block 308 whether the SYSREF CLK signal is needed or whether it is muted. In SYNC mode, the signal Q1 is first provided to SYNC GEN 404, which provides a low (0) to high (1) synchronization pulse. This low (0) to high (1) synchronization pulse resets the dividers in SYSREF generation block 308. Resetting these dividers aligns the SYSREF CLK to a main output clock (e.g., a reference clock signal).

If SYNC GEN 404 is providing a low (0) output to SYSREF generation block 308, SYSREF generation block 308 will not be reset. SYNC GEN 404 passes signal transitions only in SYNC mode. In request mode or windowing mode, SYNC GEN 404 provides a low (0) output.

As described above, system 400 provides simultaneous windowing and SYSREF generation, and glitch-free synchronization. Modifications may be made to system 400 to provide these functions and still fall within the scope of this description.

Figure 5:
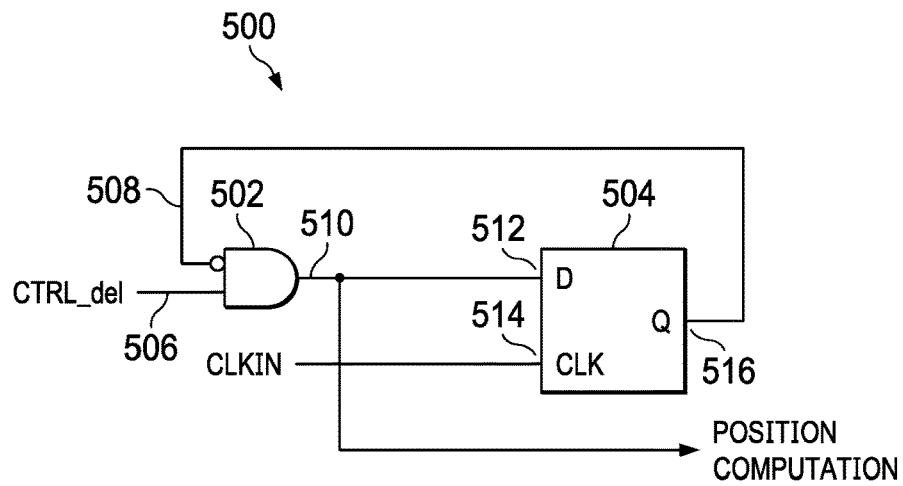
FIG. 5 is a circuit diagram of an evaluation flop for a windowing scheme in accordance with various examples.

FIG. 5 is a circuit diagram 500 of an evaluation flip-flop for a windowing scheme in accordance with various examples herein. Circuit diagram 500 is one component of an example windowing scheme described below with respect to FIG. 6. Circuit diagram 500 produces a position computation as an output. Circuit diagram 500 includes an AND gate 502 and a flop 504. AND gate 502 has a first input 506 and a second input 508. AND gate has an output 510 coupled to flop 504. Flop 504 has a D input 512, a clock (CLK) input 514, and a Q output 516, which is coupled to second input 508.

In operation, the inverted output of Q output 516 is provided to AND gate 502. If the CTRL DEL signal at first input 506 is initially low (0), the input provided to D input 512 is low (0). The output of Q output 516 stays low (0). Q output 516 stays low (0) until CTRL DEL goes high (1). After CTRL DEL goes high (1), Q output 516 will toggle and the position computation at 510 is produced as well. This circuitry allows windowing to be performed without setting any inputs or initial values for the windowing circuitry, which is described below with respect to FIG. 6.

Figure 6:
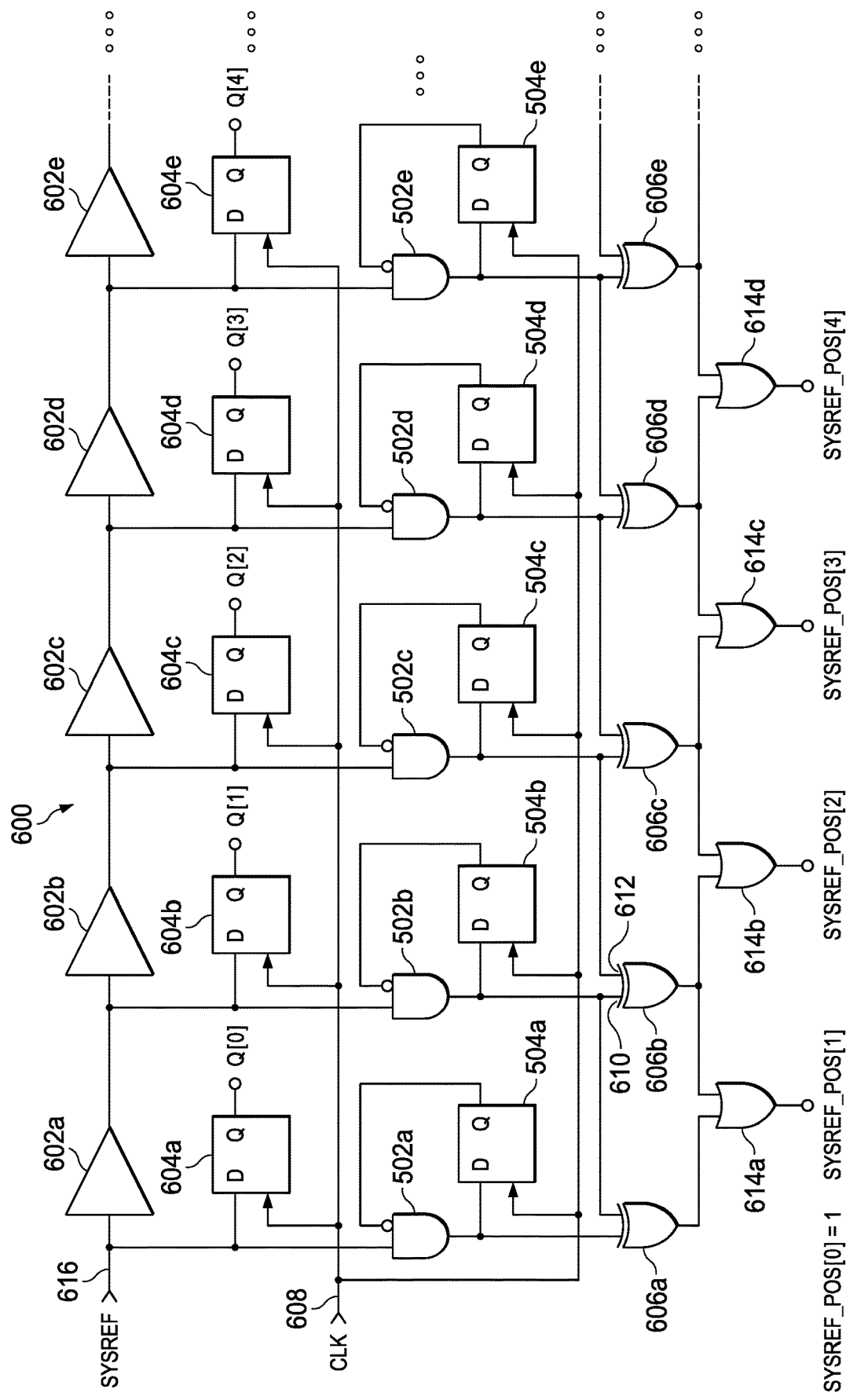
FIG. 6 is a circuit diagram of a windowing circuit in accordance with various examples.

FIG. 6 is a circuit diagram of a windowing circuit 600 in accordance with various examples herein. Windowing circuit 600 is one example of a windowing circuit, but windowing may be performed with any suitable technique in other examples. Windowing determines a position of a SYSREF signal with respect to an input clock rising edge, and provides a delayed replica of the SYSREF signal within a reliable window. Windowing circuit 600 includes AND gates 502a, 502b, 502c . . . (collectively or individually, AND gates 502), and flip-flops 504a, 504b, 504c . . . (collectively or individually, flops 504). Windowing circuit 600 also includes delay buffers 602a, 602b, 602c . . . (collectively or individually, delay buffers 602), flip-flops 604a, 604b, 604c . . . (collectively or individually, flops 604), exclusive-or (XOR) gates 606a, 606b, 606c . . . (collectively or individually, XOR gates 606), and clock (CLK) input 608. Windowing circuit 600 includes a first XOR input 610, a second XOR input 612, OR gates 614a, 614b . . . (collectively or individually, OR gates 614), and SYSREF input 616.

Windowing circuit 600 includes a number of series-coupled delay buffers 602a, 602b, 602c . . . (collectively or individually, delay buffers 602). Although five delay buffers 602 are shown, any number may be useful in other examples. Windowing circuit 600 includes multiple flops 604. Each flop 604 is a D flip-flop in this example. Windowing circuit 600 generally includes one flop 604 for each delay buffer 602. Each delay buffer 602 introduces a fixed amount of time delay between its input and output. A SYSREF signal is provided to the input of the first delay buffer 602a via SYSREF input 616. The delay buffer 602 may be any passive or active element that passes a signal with a delay. For example, a buffer can be useful as a delay buffer 602, where the buffer is non-inverting. The delay buffer 602 may have a static delay or a configurable delay. SYSREF is provided to delay buffer 602a, which produces on its output a delayed version of SYSREF. The delayed SYSREF from delay buffer 602a is provided to an input of the next delay buffer 602b in the series chain of delay buffers 602, and delay buffer 602b adds additional delay to SYSREF. As such, the outputs of the delay buffers 602 provide SYSREF with varying degrees of time delay.

Each flop 604 in this example includes a data input (D) and an output (Q). A clock input of each flop 604 receives a clock signal (CLK) at clock input 608. Responsive to an active edge (assumed to be a rising edge in the examples herein) of CLK, each flop 604 latches the logic value present on its D input on to its Q output.

Windowing circuit 600 also includes AND gates 502 and flops 504. These components are described above with respect to FIG. 5. Flops 604 and 504 are clocked with the same clock signal CLK. Each flop 504 includes a data (D) input and a Q output. Each AND gate 502 includes two inputs, with one input coupled to a corresponding delay buffer 602 and the other input coupled to the inverted Q output of a corresponding flop 504 as shown. Each AND gate 502 provides a signal on its output that is the AND of a corresponding delayed SYSREF and the inverted Q output of the corresponding flop 504. The output from an AND gate 502 is provided to the D input of the corresponding flop 504.

Windowing circuit 600 also includes exclusive-OR (XOR) gates 606 and OR gates 614. Each XOR gates 606 includes two inputs 610 and 612. XOR gate 606b has two example inputs 610 and 612. Inputs 610 and 612 of XOR gate 606b couple to the inputs of adjacent XOR gates 606a and 606c, respectively. The outputs of adjacent XOR gates 606 are then OR'd together by an OR gate 614 as shown. The outputs of the OR gates 614 are useful to identify edges of CLK at clock input 608 and are designated as SYSREF POS[n], where [n] equals 0, 1, 2, . . . . These values make up the position register. The position register indicates how far the SYSREF edge is from the clock edges. At the XOR gates 606 associated with the delay buffers 602 where the clock transitions occur, a high (1) value is output from the XOR gates 606 and provided to the two OR gates 614 coupled to the XOR gate 606. The SYSREF_POS values at the output of those two OR gates 614 are high (1), and the other SYSREF_POS values are low (0). The position register stores these SYSREF_POS values and preserves them. The select register may be programmed to according to the position of the SYSREF signal (e.g., the SYSREF_POS values) to delay the SYSREF signal such that setup and hold timing is met.

Figure 7:
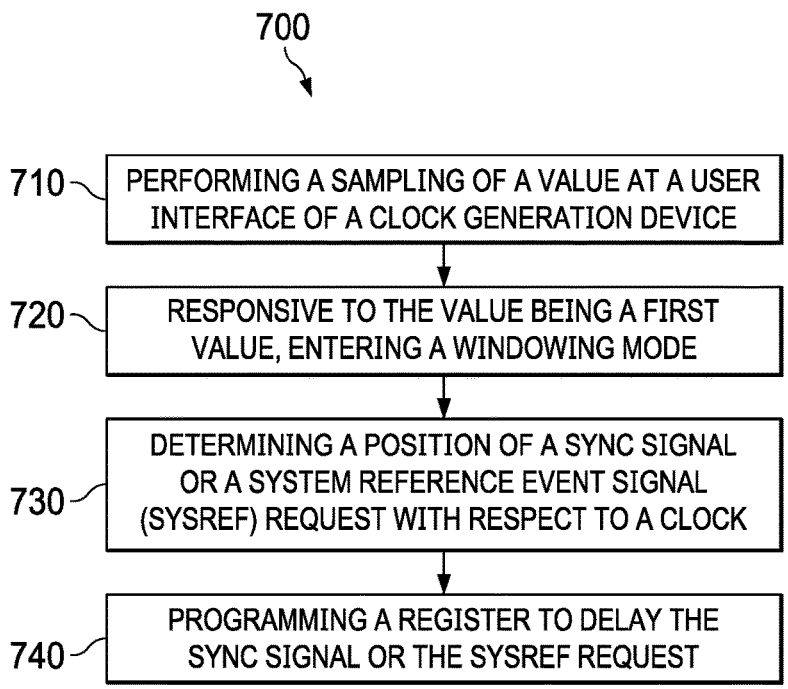
FIG. 7 is a flow diagram of a method for performing a windowing operation in accordance with various examples.

FIG. 7 is a flow diagram of a method 700 for performing a windowing operation in accordance with various examples herein. The steps of method 700 may be performed in any suitable order. The hardware components described above with respect to FIG. 4A may perform method 700 in some examples.

Method 700 begins at 710, where capture circuitry performs a sampling of a value at a user interface of a clock generation/distribution device. The value at the user interface may be set by a user in one example.

Method 700 continues at 720, where, responsive to the value being a first value, the device enters a windowing mode. Method 700 continues at 730, where a windowing operation determines a position of a SYNC signal or SYSREF request at a pin of the device with respect to a clock. In one example, the position may be determined by circuitry such as windowing circuit 600.

Method 700 continues at 740, where a register is programmed to delay the SYNC signal or the SYSREF request at the pin of the device. The register may be programmed as described above with respect to FIG. 6.

Figure 8:
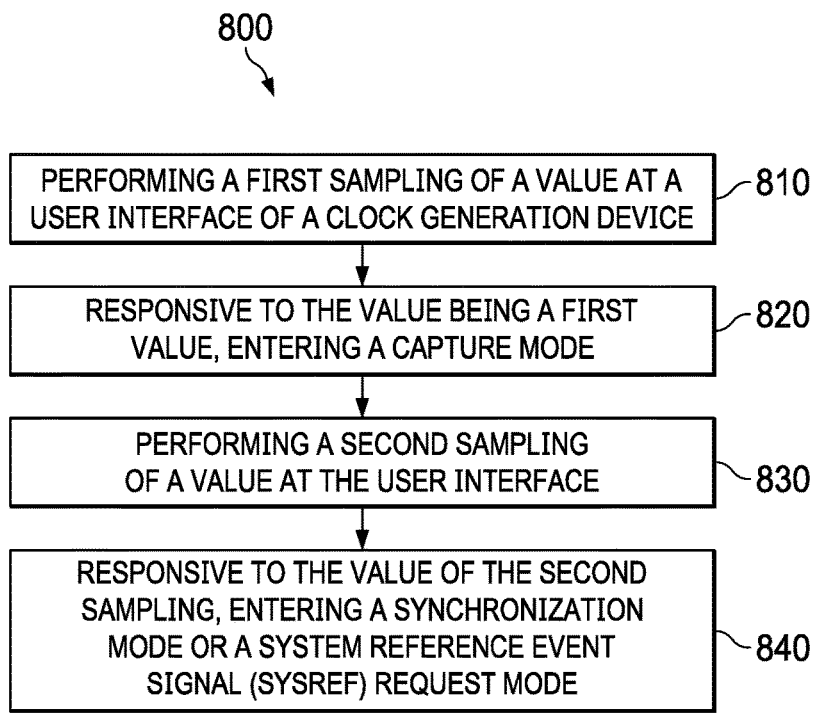
FIG. 8 is a flow diagram of a method for entering synchronization and SYSREF request mode using a single pin interface in accordance with various examples.

FIG. 8 is a flow diagram of a method 800 for entering synchronization and SYSREF request mode with a single pin interface in accordance with various examples herein. The steps of method 800 may be performed in any suitable order. The hardware components described above with respect to FIG. 4A may perform method 800 in some examples.

Method 800 begins at 810, where capture circuitry performs a first sampling of a value at a user interface of a clock generation/distribution device, such as bit 112A. The value at the user interface may be set by a user in one example.

Method 800 continues at 820, where, responsive to the value being a first value, the device enters a capture mode. Method 800 continues at 830, where the capture circuitry performs a second sampling of a value at the user interface. The value at the user interface may be set by a user (e.g., the two bits of 112A and 112B). Method 800 continues at 840, where, responsive to the value of the second sampling, the device enters a synchronization mode or a SYSREF request mode. The synchronization operations or SYSREF output may be provided as described above via a single pin input to the device.

Examples herein provide simultaneous windowing and SYSREF generation without glitches at the output. Examples herein also mute the output during SYNC to prevent glitches in the SYSREF output. A single pin provides the functionalities described herein, which makes the examples suitable for a pin-limited device. Synchronization signals may be referenced to a high frequency clock with a windowing scheme. Examples herein provide 2-bit programmability via a user interface for switching between SYNC, windowing, and SYSREF generation modes.

The term "couple" is used throughout the specification. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A. While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board. As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

Unless otherwise stated, "about," "approximately," or "substantially" preceding a value means+/−10 percent of the stated value. Modifications are possible in the described examples, and other examples are possible within the scope of the claims.

What is claimed is:

1. A system comprising:
    a clock generation device with a pin;
    a capture circuit coupled to the pin and operable to sample a value at the pin;
    a logic circuit having a first input configured to receive a clock and a second input coupled to an interface that indicates a windowing mode; and
    a D flip-flop having a data input coupled to the capture circuit, a clock input coupled to the logic circuit, and having an output, wherein the D flip-flop is operable to provide, at the output, a primary signal, and the logic circuit is operable to block the clock to the D flip-flop during the windowing mode.

2. The system of claim 1, wherein the value at the pin is a first value, and the clock generation device is operable to mute the primary signal responsive to the value at the pin being a second value.

3. The system of claim 1, wherein the logic circuit includes
    an AND gate having the first input coupled to the clock, and the second input coupled to the interface that indicates the windowing mode.

4. The system of claim 3, wherein the D flip-flop is operable to provide, at the output, the primary signal after the clock generation device switches from a non-windowing mode to the windowing mode.

5. The system of claim 3, wherein the capture circuit is operable to not sample the value on the pin during the windowing mode.

6. The system of claim 1, wherein the D flip-flop is a first D flip-flop, and the system further includes:
    a second AND gate coupled to the output of the first D flip-flop; and
    a second D flip-flop coupled to an output of the second AND gate.

7. The system of claim 6, further comprising:
    a synchronization generator coupled to the output of the first D flip-flop, wherein an output of the synchronization generator is coupled to a SYSREF generator, and wherein the synchronization generator is operable to synchronize the SYSREF generator.

8. The system of claim 7, wherein the synchronization generator is operable to be activated in a synchronization mode.

9. The system of claim 8, wherein the second AND gate is operable to receive a zero value at an input during the synchronization mode.

10. The system of claim 8 configured to generate a SYSREF signal, wherein the SYSREF signal is muted during the synchronization mode.

11. A method, comprising:
    performing a sampling of a value at a user interface of a clock generation device;

responsive to the value being a first value, entering a windowing mode;
determining a position of a synchronization (SYNC) signal or a system reference event (SYSREF) signal with respect to a clock; and
programming a register to delay the SYNC signal or the SYSREF signal.

12. The method of claim 11, further comprising:
determining a position of the SYSREF signal via a series of delay buffers.

13. The method of claim 11, further comprising:
providing the SYSREF signal during the windowing mode.

14. The method of claim 11, further comprising:
performing a second sampling of the value at the user interface;
responsive to the value being a second value, entering a synchronization mode; and
muting the SYSREF signal in the synchronization mode.

15. A method, comprising:
performing a first sampling of a value at a user interface of a clock generation device;
responsive to the value being a first value, entering a capture mode;
performing a second sampling of the value at the user interface; and
responsive to the value of the second sampling, entering a synchronization mode or a system reference event (SYSREF) signal request mode.

16. The method of claim 15, further comprising:
responsive to entering the SYSREF signal request mode, providing a SYSREF signal to a load device.

17. The method of claim 16, further comprising:
responsive to performing a third sampling of the value at the user interface, muting the SYSREF signal.

18. The method of claim 16 further comprising:
responsive to entering the synchronization mode, muting the SYSREF signal.

19. The method of claim 16, further comprising:
responsive to entering the synchronization mode, synchronizing the SYSREF signal with a reference clock signal.

20. The method of claim 19, further comprising:
exiting the synchronization mode responsive to performing another sampling of the value at the user interface.

* * * * *